United States Patent [19]
Garmong

[11] Patent Number: 5,348,844
[45] Date of Patent: Sep. 20, 1994

[54] PHOTOSENSITIVE POLYMERIC PRINTING MEDIUM AND WATER DEVELOPABLE PRINTING PLATES

[75] Inventor: Gregory O. Garmong, Escondido, Calif.

[73] Assignee: Napp Systems, Inc., San Marcos, Calif.

[21] Appl. No.: 621,640

[22] Filed: Dec. 3, 1990

[51] Int. Cl.$^5$ .............................................. G03C 1/725
[52] U.S. Cl. .................... 430/286; 430/281; 430/284; 430/287; 430/300; 430/910
[58] Field of Search ............... 430/286, 281, 910, 284, 430/287, 300

[56] References Cited

U.S. PATENT DOCUMENTS

| | | | |
|---|---|---|---|
| 2,893,868 | 7/1959 | Barney | 430/281 |
| 3,642,486 | 2/1972 | Burness et al. | 96/11 |
| 3,775,518 | 11/1973 | Endo et al. | 260/876 |
| 3,796,578 | 3/1974 | Hosoi et al. | 96/97 |
| 3,801,328 | 4/1974 | Takimoto et al. | 96/115 P |
| 3,948,667 | 4/1976 | Ichikawa et al. | 96/115 R |
| 4,023,973 | 5/1977 | Imaizumi et al. | 430/286 |
| 4,107,013 | 8/1978 | McGinniss et al. | 204/159.16 |
| 4,125,675 | 11/1978 | Sekiguchi et al. | 428/483 |
| 4,141,868 | 2/1979 | Emmons et al. | 260/23 |
| 4,163,763 | 8/1979 | Tsuchiya et al. | 525/290 |
| 4,177,074 | 12/1979 | Proskow | 430/286 |
| 4,199,619 | 4/1980 | Oda et al. | 427/150 |
| 4,265,946 | 5/1981 | Yabe et al. | 427/393.5 |
| 4,275,142 | 6/1981 | Hosaka et al. | 430/271 |
| 4,289,843 | 9/1981 | Boutle et al. | 430/271 |
| 4,304,850 | 12/1981 | Koyama et al. | 430/463 |
| 4,339,474 | 7/1982 | Kishida et al. | 427/54.1 |
| 4,360,628 | 11/1983 | Runavot et al. | 524/508 |
| 4,369,246 | 1/1983 | Chen et al. | 430/306 |
| 4,400,459 | 8/1983 | Gruetzmacher et al. | 430/306 |
| 4,400,460 | 8/1983 | Fickes et al. | 430/306 |
| 4,423,089 | 12/1983 | Sekiya et al. | 427/171 |
| 4,426,504 | 1/1984 | Nandi | 526/282 |
| 4,622,088 | 11/1986 | Min | 156/244 |
| 4,927,738 | 5/1990 | Iwanaga et al. | 430/286 |
| 4,952,481 | 8/1990 | Seio et al. | 430/286 |
| 5,073,477 | 12/1991 | Kusuda et al. | 430/287 |

FOREIGN PATENT DOCUMENTS

| | | | |
|---|---|---|---|
| 0162570 | 4/1985 | European Pat. Off. | 263/04 |
| 0164270 | 12/1985 | European Pat. Off. | G03C 1/68 |
| 0232016 | 1/1987 | European Pat. Off. | 3/80 |
| 2653822 | 11/1976 | Fed. Rep. of Germany | 5/12 |
| 53-137704 | 12/1978 | Japan | 2/44 |
| 60-009250 | 3/1985 | Japan | 2/44 |
| 61-181811 | 8/1986 | Japan | 220/6 |
| 1049035 | 2/1989 | Japan | 7/68 |
| 1049036 | 2/1989 | Japan | 1/68 |
| 1183651 | 7/1989 | Japan | 1/68 |
| 2058059 | 2/1990 | Japan | 7/3 |

OTHER PUBLICATIONS

Derwent Abstract 90-109629/03, Konishi et al., "Photosensitive resin composite for flexographic plate-has partial internal crosslinked copolymer, liner high molecule, N-contg., cmd., photopolymerisable ethylene unsatd. monomer and initator".

Primary Examiner—Marion E. McCamish
Assistant Examiner—Mark A. Chapman
Attorney, Agent, or Firm—Lyon & Lyon

[57] ABSTRACT

A photosensitive printing medium is compounded from a latex copolymer, a linear thermoplastic, elastomeric block copolymer, a basic nitrogen atom-containing compound, an ethylenically unsaturated compound, and a polymerization initiation system. The printing medium has a microstructure of distinct domains of the latex copolymer and the elastomeric block copolymer in a matrix of the other components. The printing medium is typically supported on a substrate to form a printing plate. The printing medium is photosensitive, and is imaged by exposure to actinic radiation through a photographic negative film. The unexposed portions are washed away in a water dispersive medium, without the use of organic solvents, producing a printing plate which, after drying and postexposure to UV light, is ready for printing.

20 Claims, 1 Drawing Sheet

Figure 1

PHOTOSENSITIVE POLYMERIC PRINTING MEDIUM AND WATER DEVELOPABLE PRINTING PLATES

BACKGROUND OF THE INVENTION

This invention relates to printing plates, and, more particularly, to a flexible photosensitive printing medium deposited upon a substrate to produce a printing plate.

Flexographic printing is widely used in the production of newspapers and in the decorative printing of packaging media. In flexographic printing, a layer of a flexible printing medium is coated onto a flexible substrate such as a thin sheet of steel, aluminum or synthetic polymer, to form a printing plate. A relief pattern corresponding to the negative of the image to be printed is formed in the printing medium. The plate is then mounted on the printing press, and the printing commences.

One type of printing medium is natural or synthetic rubber. This printing medium has excellent mechanical properties, but the preparation of a printing plate with a rubber printing medium is labor intensive and slow. A pattern plate and a matrix board are prepared, and rubber plates are then hot press molded. Molded rubber printing media are not practical for printing applications with short deadlines, such as newspapers. Due to the nature of the medium and the imaging techniques described above, photosensitive printing plates produce printed images of a generally superior nature to those of molded rubber media.

In another approach, the printing medium is formed of an elastomeric photopolymer composition. A layer of the photosensitive material is coated onto the substrate to form the printing plate. The coated side is exposed with light through a photographic negative of the image to be printed, causing photopolymerization of the exposed portion of the printing medium, which then becomes physically hardened and resistant to removal in a solvent. The unexposed and therefore unhardened portion of the printing medium is removed by washing in a solvent, leaving a relief pattern of the image to be printed. The printing plate is mounted on a press and printing is commenced.

Photosensitive printing plates fall into two broad categories, liquid compositions and solid compositions. The liquid compositions require the actual manufacture of the relief printing surface from a viscous liquid calendared at the printing site on complex machinery designed for that purpose. Solid photopolymer printing plates have the significant advantage of being pre-manufactured and therefore simpler and more reliable to use. Flexographic printing using photosensitive solid printing media offers the desirable combination of fast, inexpensive processing and long press runs.

There are several types of photosensitive, solid flexographic printing plates. Plates using modified thermoplastic elastomeric rubber or rubber-like printing media have excellent mechanical properties, but can be processed only In organic solvents. See, for example, U.S. Pat. Nos. 4,359,246 and 4,622,088. Plates using acrylic modified polyolefinic copolymer latex printing media are less elastic and flexible, but can be processed using water as the solvent. See, for example, U.S. Pat. Nos. 4,275,142 and 4,927,738. Plates using elastomeric copolymers with carboxyl groups in the printing medium have good mechanical properties but must be processed in aqueous alkaline mixtures of water and water-soluble organic compounds. These solvents suffer from many of tile same disadvantages as fully organic solvents.

The need to use organic solvents for processing photosensitive, solid printing plates other than the acrylic modified polyolefinic copolymer printing medium is a major obstacle in their utilization. Such solvents include, for example, methyl ethyl ketone, benzene, xylene, carbon tetrachloride, 1,1,1-trichloroethane, and trichloroethylene, alone or in combination with a cosolvent such as ethanol or isopropyl alcohol. The organic solvents present problems of adverse health effects to exposed workers, disposal without environmental damage, and risk of fires. The one type of printing medium that does not require washing in an organic-containing solvent, the acrylic modified polyolefinic copolymers, has insufficient elasticity and toughness for some printing applications such as flexible packaging.

There exists a need for a photosensitive solid printing medium and plate that combines excellent physical properties with the ability to be washed in water without the use of alkaline additives or any organic solvents. The present invention fulfills this need, and further provides related advantages.

SUMMARY OF THE INVENTION

The present invention provides a photosensitive, solid printing medium that exhibits excellent physical properties such as elasticity and toughness, long press-run life, excellent image quality, and, significantly, is developable in tap water (as long as the tap water is soft water without excessive concentrations of calcium and magnesium ions that can interfere with processing). There is therefore greatly reduced risk of fire or health damage to workers who prepare the plates, and greatly reduced risk of environmental damage upon disposal of the processing solvents. Conventional processing procedures are used for exposure and printing. Moreover, the fully processed and hardened printing medium is not water soluble, so that water-based inks can be used in printing.

In accordance with the invention, a photosensitive printing medium comprises a latex copolymer comprising an aliphatic conjugated diene monomer, an $\alpha,\beta$-ethylenically unsaturated carboxylic acid, and a polyfunctional $\alpha,\beta$-ethylenically unsaturated compound; a linear thermoplastic, elastomeric block copolymer having at least one unit of a general formula selected from the block copolymer group consisting of (A-B-A), (A-B)$_n$, and (A-B), wherein A is a non-elastomeric polymer block having a number average molecular weight of 2,000 to 100,000 and a glass transition temperature of above about 25° C., and B is an elastomeric polymer block having a number average molecular weight of 25,000 to 1,000,000 and a glass transition temperature below about 10° C.; a basic nitrogen atom-containing compound; an ethylenically unsaturated compound containing at least one terminal ethylenically unsaturated group, said compound being capable of forming a polymer by free-radical chain polymerization; and a polymerization initiator which, upon exposure to actinic radiation, initiates free-radical chain polymerization of the ethylenically unsaturated compound. A monofunctional vinyl monomer is desirably included in the latex copolymer.

The proper combination of a latex copolymer and a linear thermoplastic elastomeric block copolymer yields the unexpected result of a photosensitive printing medium that has excellent physical properties and is developable in water, without the use of alkaline additives or any organic solvents. These properties are related to the microstructure of the composite material. In accordance with this aspect of the invention, a photosensitive printing medium having a composite structure comprises discrete domains of water dispersible latex copolymer, discrete domains of an elastomer, and a photopolymerizable interstitial phase that binds the domains of latex copolymer and elastomer together, and contains a photopolymerizable compound and a photoinitiator.

A key feature of this structure is the discrete domains of latex copolymer and elastomer bound together with the photopolymerizable interstitial phase. In some combinations of materials investigated but that are not within the scope of the invention, the ingredients combined in a uniformly intermixed form, without discrete domains. These materials with a uniformly intermixed microstructure could not be processed with water as the sole solvent. The interstitial phase is a mixture of compounds that is disposed between the domains. The interstitial phase is photopolymerized in those areas exposed to actinic light, hardening the exposed areas and preventing the domains of latex copolymer and elastomer from being washed away in subsequent processing. The unexposed areas of the interstitial phase are not hardened, and are washed away in subsequent processing along with the domains of latex copolymer and elastomer material in the unexposed regions.

The present approach therefore provides an important advance in the art of flexographic printing technology. Highly elastic, tough printing media, which are developable in water, are available through this approach. Other features and advantages of the invention will be apparent from the following more detailed description of the preferred embodiments, taken in conjunction with the accompanying drawings, which illustrate, by way of example, the principles of the invention.

BRIEF DESCRIPTION OF THE DRAWINGS

FIG. 2 is an electron photomicrograph of the structure of the printing medium of the invention labelled to show the various phases and domains.

DETAILED DESCRIPTION OF THE PREFERRED EMBODIMENTS

Figure 1:
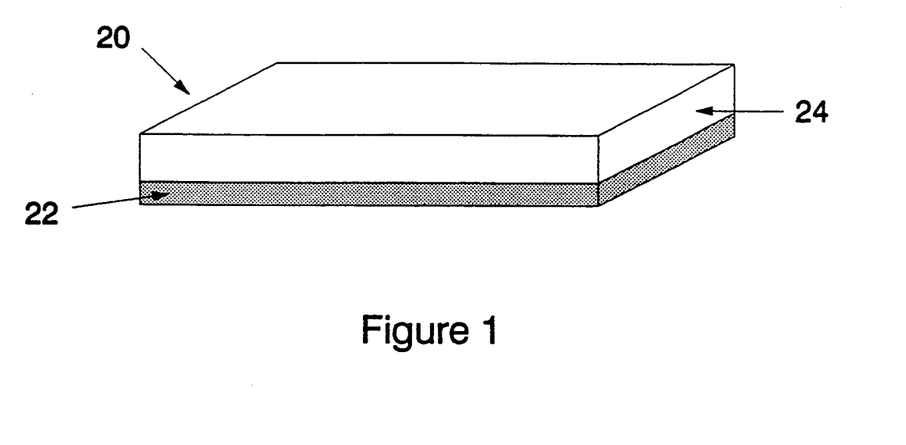
FIG. 1 is a perspective view of a printing plate.

FIG. 1 depicts a typical printing plate 20, formed of a supporting substrate 22 and a layer of a printing medium 24 fixed to the substrate 22. The substrate is typically a thin, flexible sheet of aluminum, steel, or synthetic polymer about 0.002 to about 0.010 inches thick. The printing medium 24 is prepared according to the invention and coated onto the substrate in a manner to be described. The printing medium 24 is typically from about 0.010 to about 0.250 inches thick, depending upon the specific printing application. The most preferred printing medium thickness is about 0.015 to about 0.125 inches.

In accordance with a preferred embodiment of the invention, a photosensitive printing medium comprises from about 25 to about 75 percent by weight of a latex copolymer comprising from about 5 to about 95 mol percent of an aliphatic conjugated diene monomer, from about 1 to about 30 mol percent of an $\alpha,\beta$-ethylenically unsaturated carboxylic acid monomer, from about 1 to about 30 mol percent of a polyfunctional $\alpha,\beta$-ethylenically unsaturated vinyl monomer, and from about 0 to about 70 mol percent of a monofunctional vinyl monomer; from about 15 to about 50 percent by weight of a linear thermoplastic, elastomeric block copolymer having at least one unit of a general formula selected from the block copolymer group consisting of (A-B-A), (A-B)$_n$, and (A-B), wherein A is a non-elastomeric polymer block having a number average molecular weight of 2,000 to 100,000 and a glass transition temperature of above about 25° C., and B is an elastomeric polymer block having a number average molecular weight of 25,000 to 1,000,000 and a glass transition temperature below about 10° C.; a basic nitrogen atom-containing compound present in an amount of from about 0.02 to about 2.5 mole per mole of acid groups on the latex copolymer; from about 10 to about 60 percent by weight of an ethylenically unsaturated compound containing at least one terminal ethylenically unsaturated group, the compound being capable of forming a polymer by free-radical chain polymerization; and from about 0.001 to about 10 percent by weight of a polymerization initiator which, upon exposure to actinic radiation, initiates free-radical chain polymerization of the ethylenically unsaturated compound.

In the latex copolymer, the aliphatic conjugated diene monomer is preferably 1,3-butadiene, isoprene, dimethylbutadiene, or chloroprene. Most preferably, the conjugated diene monomer is 1,3-butadiene. The $\alpha,\beta$-ethylenically unsaturated carboxylic acid is preferably (meth)acrylic acid, maleic acid, fumaric acid, citraconic acid, or crotonic acid. Most preferably, the $\alpha,\beta$-ethylenically unsaturated carboxylic acid is (meth)acrylic acid. The polyfunctional vinyl monomer is preferably trimethylolpropane di(meth)acrylate, trimethylolpropane tri(meth)acrylate, divinylbenzene, ethylene glycol di(meth)acrylate, polyethylene glycol di(meth)acrylate, pentaerythritol tri(meth)acrylate, 1,4-butanediol di(meth)acrylate, or 1,6-hexanediol di(meth)acrylate. Most preferably, the polyfunctional vinyl monomers are divinyl benzene and ethylene glycol dimethacrylate. The latex copolymer optionally contains a monofunctional vinyl monomer. The monofunctional vinyl monomer preferably styrene, methylstyrene, vinyltoluene, acrylonitrile, vinyl chloride, vinylidene chloride, (meth)acrylamide, methyl (meth)acrylate, ethyl (meth)acrylate, n-butyl (meth)acrylate, and 2-ethylhexyl (meth)acrylate. Most preferably, the monofunctional vinyl monomer is either methyl methacrylate or styrene.

The thermoplastic, elastomeric block copolymer has at least one unit of the general form (A-B-A), (A-B)$_n$, or (A-B), where each A unit is a non-elastomeric polymeric block appended to an elastomeric polymer block B. The (A-B-A), (A-B)$_n$, or (A-B) unit may describe the general formula of the block copolymer or additional (A-B-A), (A-B)$_n$, or (A-B) units may be appended to it to form a repeating structure. It is possible to vary the nature of the A and B units, for example using two different terminal, non-elastomeric A blocks within the (A-B-A), (A-B)$_n$, or (A-B) structure, or using two or more different elastomeric materials within the B block. Additionally, the repeating structure may be appended to another polymer.

The non-elastomeric polymeric unit A is preferably the polymerization product of aromatic hydrocarbons containing vinyl unsaturation. Most preferably the nonelastomeric unit A is polystyrene. The elastomeric unit B is the polymerization product of aliphatic conjugated diolefinic compounds such as 1,3-butadiene and isoprene. Most preferably, the elastomeric unit B is polybutadiene or polyisoprene.

A particularly preferred linear, thermoplastic block copolymer is a block copolymer of polystyrene attached to each end of a middle block of polybutadiene or polyisoprene. Such preferred forms include polystyrene-polybutadiene-polystyrene and polystyrene-polyisoprene-polystyrene, with the polyolefin block being 60-90 percent by weight of the block copolymer. Examples of useful thermoplastic elastomer block copolymers are manufactured by the Shell Chemical Company and sold under the trademark Kraton ®.

The basic nitrogen-atom containing compound has a tertiary basic nitrogen atom and preferably includes a vinyl group capable of participating in free-radical polymerization during exposure to actinic radiation with the ethylenically unsaturated compound in the interstitial phase. The basic nitrogen-atom containing compound is preferably N,N-dimethylaminoethyl (meth)acrylate, N,N-dimethylaminopropyl (meth)acrylamide, N,N-dimethylaminopropyl (meth)acrylate, N,N-dimethylaminoethyl-N'-(meth)acryloylcarbamate, N,N-dimethylaminoethoxyethanol, or N,N-dimethylaminoethoxyethoxyethanol. Most preferably, the basic nitrogen-atom containing compound is N,N-dimethylaminopropyl (meth)acrylamide.

The ethylenically unsaturated compound may be any compound having ethylenic unsaturation. The ethylenically unsaturated compound is preferably an unsaturated carboxylic ester such as n-butyl (meth)acrylate, 2-ethylhexyl (meth)acrylate, lauryl (meth)acrylate, stearyl (meth)acrylate, polyethylene glycol mono(-meth)acrylate, ethylene glycol di(meth)acrylate, polyethylene glycol di(meth)acrylate, diallyl itaconate, dibutyl fumarate, dibutyl maleate, glycerol di(meth)acrylate, glycerol tri(meth)acrylate, 1,3-propylene glycol di(meth)acrylate, 2-hydroxyethyl (meth)acrylate, 1,4-cyclohexanediol di(meth)acrylate, 1,2,4-butanetriol tri(-meth)acrylate, 1,4-benzenediol di(meth)acrylate, pentaerythritol tetra(meth)acrylate, 1,4-butanediol di(meth-)acrylate, or 1,6-hexanediol di(meth)acrylate; an unsaturated amide such as methylene bis(meth)acrylamide, ethylene bis(meth)acrylamide, or 1,6-hexanediamine bis(meth)acrylamide; a divinyl ester such divinyl adipate or divinyl phthalate; an acrylated or methacrylated aliphatic or aromatic urethane derived from hydroxyalkyl (meth)acrylates and isocyanate compounds; and a di(meth)acrylic ester of a diepoxypolyether derived from an aromatic compound with polyalcohols such as blsphenol or Novolac compounds.

The proper choice of the ethylenically unsaturated compound permits realization of the greatest benefits of the invention. A primary consideration in the choice of ethylenically unsaturated compounds is their compatibility with the polymeric ingredients. In the present invention, compatibility is associated with the ability of the ethylenically unsaturated compounds to be absorbed by one or more of the polymeric ingredients and the clarity of the resulting photosensitive resin composition after all of the Ingredients have been properly combined and formed into a sheet of the desired thickness, typically from about 0.010 inches to about 0.250 inches. It is found that inadequate compatibility of the ethylenically unsaturated compounds, as defined by absorption into one or more of the binder polymers, causes unusably low resin viscosities and severe cold flow properties. Excessive compatibility of the ethylenically unsaturated compounds, as defined by nearly complete absorption into one or more of the binder polymers, causes the photosensitive resin composition to have a flaking, dry consistency with poor film-forming properties. Such a composition can not be formed into a sheet for use as a printing medium. It is preferable in the present invention that the compounded photosensitive resin forms coherent films and has a Mooney viscosity in the range of about 40 to about 100 (ML1+4(45° C.), ASTM D 1646-74).

Poor compatibility of the ethylenically unsaturated compounds, as defined by the creation of hazy photosensitive resin compositions of poor clarity, causes scattering of actinic radiation when formed into sheets for use as a printing medium. A slight haze can be tolerated in many printing relief applications, but should be avoided when the desired relief image contains fine detail. The scattering of actinic radiation during exposure of the photosensitive resin composition through the photographic negative can cause the desired image to be obscured and therefore not realized. A combination of ethylenically unsaturated compounds is usually required to obtain all of the desired properties of the compounded photosensitive resin.

The presently most preferred ethylenically unsaturated is compound a combination of (meth)acrylated aliphatic urethane oligomers and dibutyl fumarate.

The polymerization initiation system is composed of compounds which, upon exposure to actinic radiation, homolytically decompose or otherwise react to produce free radicals which can initiate free-radical polymerization. The initiation system is preferably benzoin ethers such as benzoin isopropyl ether or benzoin isobutyl ether; benzophenones such as benzophenone or methyl o-benzoylbenzoate; xanthones such as xanthone, thioxanthone or 2-chlorothioxanthone; acetophenones such as acetophenone, 2,2,2-trichloroacetophenone, 2,2-diethoxyacetophenone, or 2,2-dimethoxy-2-phenylacetophenone; quinones such as 2-ethylanthraquinone, 2-t-butylanthraquinone, phenanthraquinone, or 1,2-benzanthraquinone; and acyl phosphine oxides such as methyl 2,6-dimethylbenzoyl phenylphosphinate, methyl 2,6-dimethoxybenzoyl phenylphosphinate, 2,6-dimethylbenzoyldiphenylphosphine oxide, or 2,4,6-trimethylbenzoylphenylphosphine oxide. Most preferably, the polymerization initiation system is either 2,2-dimethoxy-2-phenylacetophenone or 2-alkylanthraquinones.

The photosensitive composition of the invention may optionally contain a small amount of a thermal polymerization inhibitor, for example hydroquinone, hydroquinone monomethyl ether, mono-t-butylhydroquinone, catechol, p-t-butylcatechol, 2,6-di-t-butyl-p-cresol, or benzoquinone. Dyes such as eosin Y or rose bengal may be added. Plasticizers such as dialkyl phthalate, dialkyl sebacate, alkyl phosphate, polyethylene glycol, naphthenic oils, parafinic oils, polyethylene glycol esters, polyethylene glycol ethers, phenoxy polyethylene glycols, alkylphenoxy polyethylene glycols, and glycerol may be added. Antlozonants such as microcrystalline wax, paraffin wax, dibutylthiourea and unsaturated vegetable oils may also be added.

The latex copolymer is present in an amount of from about 25 to about 75 percent by weight of the total composition. If less than about 25 percent is present, the photoimaged printing medium cannot be developed in water. If more than about 75 percent is present, the physical properties such as elasticity and toughness of the photocured composition are inadequate.

The linear, thermoplastic block copolymer is present in an amount of about 15 to about 50 percent by weight of the total composition. If less than about 15 percent is present, the physical properties such as elasticity and toughness are inadequate. If more than about 50 percent is present, the photoimaged printing medium cannot be developed in water.

The basic nitrogen atom-containing compound is present in an amount of from about 0.02 to about 2.5 moles per mole of acid groups on the latex copolymer. The neutralization of the carboxyl groups of the latex copolymer by the tertiary amine group of the basic nitrogen atom-containing compound allows the latex to be dispersed in water or aqueous solvents. If less than about 0.02 moles per mole is present, the photoimaged printing medium cannot be developed in water. If more than about 2.5 moles per mole is present, there is excessive swelling of the cured, processed plate in water or water-based inks.

The ethylenically unsaturated compound, preferably a mixture of such compounds, is present in an amount of from about 10 to about 60 percent by weight of the total composition. If less than about 10 percent is present, there is inadequate curing of the printing medium during UV exposure. Also, the compounded resin has an unworkable viscosity, with the compounded resin being flaky and dry. If more than about 60 percent is present, the viscosity of the resin is too low due to the presence of too much liquid in the mixture. The final cured film may also be too brittle due to excessive crosslinking of the interstitial phase and too little base polymer.

The photoinitiator is present in an amount of from about 0.001 to about 10 percent by weight of the total composition. If less than about 0.001 percent is present, curing is slow or inadequate, or both. If more than about 10 percent of photoinitiator is present, light cannot penetrate the full thickness of the plate and there is insufficient through-cure due to excessive absorption of light on the top surface of the photosensitive printing medium. Curing of the composition at the resin-adhesive or resin-substrate interface often is needed for adequate adhesion, and too much photoinitiator may prevent curing at or near the interface.

The photosensitive compositions are prepared by using conventional mixing and milling techniques well known in the art. The ingredients (latex copolymer, thermoplastic, elastomeric block copolymer, basic nitrogen-atom containing compound, ethylenically unsaturated compound, and polymerization initiation system, and optional ingredients) can be compounded using a mixer, kneader, or extruder. The components may be combined at the start of the compounding process, or alternatively, the latex copolymer and linear thermoplastic elastomeric block copolymer may be prekneaded. Alternatively, one or more of the liquid components may be preabsorbed into either of the polymeric phases. The resulting compositions can be formed into a photosensitive medium element by forming into a sheet by molding, calendaring, rolling, extruding, or a similar process.

To form a printing plate, the photosensitive printing medium is laminated onto a suitable solid substrate or, an intermediate adhesive layer may be used. In accordance with this aspect of the invention, a flexible printing plate comprises a supporting substrate; and a layer of a photosensitive printing medium supported on the substrate, the printing medium having a composite structure comprising discrete domains of latex copolymer, discrete domains of an elastomer, and a photopolymerizable interstitial phase that binds the domains of latex copolymer and elastomer together, and contains a photopolymerizable compound and a photoinitiator. If desired, an antihalation layer may be used between the photosensitive sheet and the substrate.

A variety of substrates may be used with the photosensitive compositions. The term "substrate" means any solid layer giving support and stability to the photosensitive medium. Particularly useful substrates are natural or synthetic materials that can be made into a rigid or flexible sheet form. Substrate materials include metals such as steel, copper or aluminum sheets, plates, or foils; paper; or films or sheets made from synthetic polymeric materials such as polyesters, polystyrene, polyolefins, or polyamides, used either alone or as laminates, and foam sheets.

A cover sheet may be used on the surface of the photosensitive composition opposite that laminated to the substrate to protect the surface from contamination or damage during shipping, storage, and handling. Such cover sheets are well known in the art. See for example U.S. Pat. Nos. 4,323,637 and 4,369,246, whose disclosures are incorporated by reference. It is often desirable to incorporate into the photosensitive element a layer between the cover sheet and the photosensitive composition that is soluble in the processing solvent and which remains on the surface of the photosensitive composition upon removal of the cover sheet. Such surface layers, well known in the art, can be useful to reduce the tackiness of the element's surface or to modify the photosensitive properties of the element, as by dyes or pigments.

Printing plates are made by exposing selected portions of the photosensitive layer of the element to actinic radiation. In accordance with this aspect of the invention, a process for providing a printing plate ready for printing comprises the steps of providing a flexible printing plate comprising a substrate; and a layer of a photosensitive printing medium supported on the substrate, the printing medium having a composite structure comprising discrete domains of latex copolymer, discrete domains of an elastomer, and a photopolymerizable interstitial phase that binds the domains of latex copolymer and elastomer together, and contains a photopolymerizable compound and a photoinitiator; exposing portions of the printing medium with actinic light through a negative; and washing away the unexposed portions of the printing medium in a dispersive medium consisting essentially of water.

The photosensitive medium is sometimes first generally exposed with actinic light, from its backside through the supporting substrate prior to exposure from the frontside through the negative, to partially harden the photosensitive medium material at and near the interface with the substrate. This back-exposure technique improves the bonding between the printing medium and the substrate, and also creates a subsurface hardened layer which acts as a "floor" after subsequent exposure and washout of the front side of the printing medium through the negative.

Selective exposure of the photosensitive medium is achieved by the use of an image-bearing transparency such as a negative film on the surface of the photosensitive layer, through the front side of the photosensitive medium. Areas of the transparency opaque to the actinic radiation prevent the initiation of free-radical polymerization within the photosensitive layer directly underneath them. Transparent areas of the image-bearing element will allow the penetration of actinic radiation into the photosensitive layer, initiating free-radical polymerization, rendering those areas insoluble in the processing solvent, in this case water. The unexposed portions of the photosensitive layer are then selectively removed by washing in water. The washing may be performed by a variety of processes, including brushing, spraying, or immersion. Brushing is usually preferred as it aids in the removal of soluble portions and reduces the washing time required. The resulting surface has a relief pattern that reproduces the image to be printed, the relief portions extending above the prehardened floor layer (if any) produced by the backexposure processing. Raised portions carry ink to the surface being printed during the printing operation.

The resulting image-bearing printing plate can optionally be further prepared prior to use. After processing, the wet printing plate is dried, as with a forced hot air dryer or a convection oven. Exposure of the entire cured, processed photosensitive layer to actinic radiation for several minutes is often desirable to increase toughness and reduce surface tack. The surface may be treated with an oxidizing solution such as aqueous acidic hypochlorite or aqueous bromine solutions to reduce surface tack. Such surface treatments are well known in the art. See for example, U.S. Pat. Nos. 4,400,459 and 4,400,460, whose disclosures are incorporated by reference.

In the printing plate and printing medium of the present invention, selective removal of the unreacted photosensitive composition layer is achieved by brushing or spraying the element with water heated to about 25°–75° C. for about 5–30 minutes. Increased water temperature generally decreases the time required to remove the desired portions. It is important to use "soft" water, that is, water from which metallic cations such as $Ca^{+2}$, $Mg^{+2}$, and $Fe^{+2}$ have been removed, during the washing process. The presence of these inorganic cations impedes the dispersion of unpolymerized areas. Commonly available water softening systems (such as ion exchange systems) are suitable for pre-treating the water used to remove the unreacted photosensitive composition. The processed plate is dried in an oven at about 50°–80° C. for about 5–15 minutes. The processed plate is then postexposed to ultraviolet (UV) light for about 15 seconds to 10 minutes to further toughen the plate. These last two steps are utilized in the processing of other types of photosensitive printing plates, but the required times are much longer for those other types of plate. Generally, no further surface treatments such as oxidation, which are necessary for some other photosensitive printing plates, are needed before the plate is used.

The photosensitive medium material of the present invention utilizes a combination of a hydrophilic copolymer latex and a hydrophobic linear thermoplastic elastomer block copolymer. The hydrophilic copolymer latex contains carboxyl groups, which when neutralized with the basic nitrogen atom-containing compound, impart to the latex water dispersibility. The copolymer latex is internally crosslinked and therefore maintains spherical latex microstructure after compounding with the other ingredients used to produce the photosensitive composition. These compositions rely on the photoinitiated polymerization during exposure to actinic radiation of reactive compounds present between and absorbed into the latex particles for the formation of a strong, cohesive film. Such microstructures often do not possess physical properties such as good elasticity, toughness, and abrasion resistance. The linear thermoplastic elastomer block copolymers possess long homopolymer blocks of aromatic and aliphatic comonomers which cause the formation of discrete phases. The aromatic phases impart good toughness and thermoplastic properties while the aliphatic domains impart good elasticity. These linear thermoplastic block copolymers are hydrophobic by nature and are not solubilized by water.

The microstructure of the photosensitive printing medium of the invention can be depicted in a photomicrograph obtained by sectioning a specimen of the printing medium made in accordance with the invention, and shadowing it with $OsO_4$. The structure contains discrete domains of a latex copolymer and discrete domains of elastomeric block copolymer. The domains are generally roughly equiaxed and range from about 0.1 to about 0.5 micrometers in size. An interstitial phase between the domains binds the domains together. The discrete domains of the latex copolymer occupy from about 25 to about 75 percent by volume of the medium, and the discrete domains of the elastomer occupy from about 15 to about 50 percent by volume of the medium. This structure is significant in permitting achieving improved properties while maintaining water processability. Water can penetrate the unreactive portions, solubilizing the unreacted interstitial phase and dispersing the hydrophilic latex particle domains. The voids thus formed cannot support the hydrophobic elastomer domains exposed to the water, which are removed by the processing action. Alternatively, had the microstructure been a single homogenous mass without the domain structure of discrete domains of latex copolymer and elastomer block copolymer, water processability would not have been possible. Although domain structures for latex block copolymer-based printing media are known, it is surprising that a substantial amount of elastomeric block copolymer can be added without loss of the discrete domain structure or transition to a homogenous mass microstructure.

The use of the two types of copolymers in combination imparts to the photosensitive resin composition excellent physical properties such as elasticity, toughness, and abrasion resistance. Significantly, from about 15–50 percent by weight of the hydrophobic block copolymer does not prevent the development of the composition in pure water. Thin strands of linear copolymer often connect the elastomer domains. The presence of rubbery hydrophilic latex domains imparts the property of water processability. The presence of hydrophobic elastomer domains imparts the improved physical properties.

The following examples are intended to illustrate aspects of the invention, and should not be taken as limiting of the invention in any respect.

EXAMPLE 1

Preferred Composition

A latex copolymer was provided having a composition in weight percent of 70 percent 1,3-butadiene, 20 percent styrene, 6 percent methacrylic acid, and 4 percent divinyl benzene.

To 30.7 grams of this latex copolymer was added a mixture of the following: 7.3 grams of N,N-dimethylaminopropyl methacrylamide, 4.9 grams difunctional aliphatic urethane oligomer (Sartomer C-9504), 25.6 grams dibutyl fumarate, 0.3 grams 2-t-butylanthraquinone, and 0.5 grams 2,6-di-t-butyl-p-cresol.

The latex copolymer was allowed to absorb the mixture for 12 hours and was then compounded with 30.7 grams of styrene-isoprene-styrene (86weight percent isoprene) block copolymer (Shell Kraton® D-1107) using a two-roll mill at 70° C. until clear and uniform in appearance, which required about 1 hour. The resulting compound was a non-tacky solid. This compound was placed between two sheets of polyester terephthalate (duPont Mylar®) and pressed into a sheet 0.060 inches thick. The photosensitive composition was removed from the polyester film and was laminated onto a 0.005 inch thick sheet of polyester terephthalate which had been previously coated with a film about 2 micrometers thick of a commercial polyurethane adhesive. The photosensitive composition was back-exposed through the polyester substrate for 30 seconds to ultraviolet radiation from a bank of Sylvania 115W Blacklight fluorescent lamps at a distance of about 2 inches. The substrate was then turned away from the light source and a photographic negative with the desired image was contacted with the photosensitive resin composition. The composition was exposed for 4 minutes through the negative. After removing the negative, the unexposed, non-image area was washed away in a brush-type processor using water heated to 40° C., for 4 minutes. The resulting printing plate had floor and relief layers each about 0.030 inches thick. The processed printing plate was dried at 80° C. for 5 minutes and postexposed using the same light source for 3 minutes. The resulting printing plate exhibited good toughness and flexibility, and was non-tacky.

Physical properties of specimens of the printing media were measured with the following results: Shore A hardness, 32; resilience, 53 percent; tensile strength, 19 kilograms per square centimeter; 234 percent elongation; and no cracking when bent, after exposure and processing, completely back upon itself. (In the last test, a sample of the exposed and processed printing medium material is bent around rods of decreasing diameter, until cracking is observed. In the test of the preferred material, no cracking was observed in the test even when no rod was used, and the resin was bent back upon itself.)

The printing plate was mounted on a flexographic printing press and printed with a variety of inks, including water-based, alcohol-based, and organic solvent-based types. The printing plate showed good reproduction of the original image and long run life.

EXAMPLE 2

Less Preferred Composition Within the Scope of the Invention

A latex copolymer was prepared having a composition, in weight percent, of 70 percent. 1,3-butadiene, 20 percent methyl methacrylate, 6 percent methacrylic acid, and 4 percent ethylene glycol dimethacrylate.

To 40.0 grams of the latex copolymer was added a mixture of the following: 7.3 grams of N,N-dimethylaminopropyl methacrylamide, 4.9 grams difunctional aliphatic urethane oligomer (Sartomer C-9504), 25.5 grams dibutyl fumarate, 0.3 grams 2-t-butylanthraquinone, and 0.5 grams 2,6-di-t-butyl-p-cresol.

After absorption as described in Example 1, the ingredients were compounded with 21.5 grams of styrene-isoprene-styrene (86 weight percent isoprene) (Kraton$^R$ D-1107) block copolymer as described in Example 1. A printing plate was made from the resulting photosensitive compound and exposed and processed as described in Example 1, except that the washing time was 8 minutes.

The resulting cured composition had the following physical properties: Shore A hardness, 37; resilence, 57 percent; tensile strength, 12 kilograms per square centimeter; 168 percent elongation; and no cracking when bent completely back upon itself.

EXAMPLE 3

Insufficient Linear, Thermoplastic, Elastomeric Block Copolymer

A latex copolymer was prepared having a composition in weight percent of 69 percent 1,3-butadiene, 20 percent methyl methacrylate, 6 percent methacrylic acid, and 2 percent divinyl benzene.

To 49.2 grams of the latex copolymer was added a mixture of the following: 5.0 grams of ethoxy bisphenol A diacrylate, 4.9 grams of 1,6-hexane diol dimethacrylate, 5.5 grams of lauryl methacrylate, 15.0 grams of dibutyl fumarate, 0.3 grams 2-ethylanthraquinone, and 0.5 grams 2,6-di-t-butyl-p-cresol.

After absorption as described in Example 1, the ingredients were compounded with 12.3 grams of styrene-isoprene (90 weight percent isoprene) block copolymer (Kraton® 1320X), as described in Example 1. The photosensitive resin was formed, cured, and processed as in Example 1, except that a washing time of 4 minutes was used. The resulting cured compound was harder and had elasticity and toughness inferior to those of the compounds of Examples 1 and 2. The cured composition had the following physical properties: Shore A hardness, 60; resilience, 37 percent; tensile strength, 25 kilograms per square centimeter; 64 percent elongation; and crackling when bent around a rod of 2 millimeters diameter.

EXAMPLE 4

Non-block-type Copolymer

A latex copolymer was prepared having a composition in weight percent of 69 percent 1,3-butadiene, 20 percent methyl methacrylate, 9 percent methacrylic acid, and 2 percent divinyl benzene.

To 36.9 grams of the latex copolymer was added a mixture of the following: 24.6 grams of butadiene-acrylonitrile copolymer (BF Goodrich Proteus® 9500, a non-block copolymer), 7.3 grams N,N-dimethylaminopropyl methacrylamide, 5.0 grams difunctional aliphatic urethane oligomer (Sartomer C-9504), 4.9 grams 1,6-hexane diol dimethacrylate, 5.5 grams lauryl methacrylate, 15.0 grams dibutyl fumarate, 0.3 grams 2-ethylanthraquinone, and 0.5 grams 2,6-di-t-butyl-p-cresol.

The mixture was compounded on a two-roll mill as described in Example 1. The photosensitive resin was formed, cured, and processed as in Example 1, except that it was found that the composition could not be washed in water to remove unexposed resin. The compound had the following physical properties: Shore A hardness, 57; resilience, 35 percent; tensile strength, 25 kilograms per square centimeter; 87 percent elongation; and no cracking was observed when the exposed and processed printing medium was bent completely back upon itself.

EXAMPLE 5

No Latex Copolymer

A mixture of 11.5 grams N,N-dimethylaminopropyl methacrylamide, 7.9 grams ethoxylated bisphenol A diacrylate, 7.7 grams 1,6-hexane -diol diacrylate, 8.7 grams lauryl methacrylate, 23.8 grams dibutyl fumarate, 0.5 grams 2-ethylanthraquinone, and 0.9 grams 2,6-di-t-butyl-p-cresol was combined with 39.0 grams of styrene-isoprene-styrene (86 weight percent isoprene) block copolymer (Kraton ® D-1107). The combined ingredients were allowed to stand for 20 hours, at which time little of the liquid was absorbed into the block copolymer. Compounding with a two-roll mill at 70° C. for several hours resulted in a soft, sticky resin that exhibited cold flow characteristics. It was not possible to form a sheet of sufficient quality to measure the same physical properties measured in the other examples. A cured sheet of the resin could not be processed in water.

EXAMPLE 6

No Block Copolymer

A latex copolymer was prepared having a composition in weight percent of 70 percent 1,3-butadiene, 20 percent methyl methacrylate, 6 percent methacrylic acid, and 4 percent ethylene glycol dimethacrylate.

To 59.4 grams of the latex copolymer was added a mixture of the following: 5.8 grams of N,N-dimethylaminopropyl methacrylamide, 5.4 grams polyethoxy phenol, 5.4 grams polyethoxy nonylphenol. 10.8 grams lauryl methacrylate, 5.5 grams diethylene glycol dimethacrylate, 5.5 grams polyethylene glycol (400) diacrylate, 1.8 grams 2,2-dimethoxy-2-phenylacetophenone, and 0.4 grams 2,6-di-t-butyl-p-cresol.

The ingredients were compounded using a two-roll mill as described in Example 1 and processed as in Example 1 to a printing plate, except that the exposure time through the negative film was reduced to 80 seconds and the washing time in water was 3 minutes. The cured film had the following physical properties, which are not:: suitable for use as a flexographic printing plate: Shore A hardness, 72; resilence, 30 percent; tensile strength, 18 kilograms per square centimeter; 39 percent elongation; and cracking was observed when the printing medium was bent around a rod having a diameter of 6 millimeters.

When printed on a flexographic printing press, wearing of the relief layer was quickly observed, resulting in poor reproduction quality.

EXAMPLE 7

Determination of Dependence of Properties on Amount of Thermoplastic, Elastomeric Block Copolymer A photosensitive resin composition was prepared as described in Example 6. Styrene-isoprene-styrene block copolymer (Kraton ® D-1107) at varying weight-percent levels was added to portions of the composition by compounding on a two-roll mill. The resulting compounds were formed into sheets 0.060 inches thick and laminated onto a substrate as described in Example 1. These printing plates were processed as described in Example 1 until about 0.030 inches of the unexposed resin composition was removed. The required processing times for unreacted polymer washout in tap water were as shown in the following table

| Block Copolymer (Weight Percent) | Processing Time (Minutes) |
| --- | --- |
| 10 | 3 |
| 20 | 5 |
| 30 | 8 |
| 40 | 18 |
| 50 | more than 60 |

The processing time is a key consideration In a production operation. Acceptable processing times are obtained with block copolymer percentages of up to 50 percent. However, the lesser block copolymer contents below about 15 weight percent produce unacceptable mechanical properties, see Example 3 where the block copolymer content is 12.3 percent.

It is therefore concluded that the block copolymer should be present in an amount of from about 15 to about 50 percent. Above about 25 percent, the processing times begin to lengthen to unacceptably high values. Very short processing times are also not desirable, because the processing may be difficult to control precisely. A preferred block copolymer content is about 25 percent. Such a resin composition has a combination of good mechanical properties and good processability in a commercial printing operation.

EXAMPLES 8–23

Use of Other Compositions

A series of specimens using various ingredients was prepared and mechanically tested in the manner discussed previously. The following table reports the compositions and results:

| Composition | Example | | | | | | | | |
| --- | --- | --- | --- | --- | --- | --- | --- | --- | --- |
| | 8 | 9 | 10 | 11 | 12 | 13 | 14 | 15 | 16 |
| Latex Content | 36.9 | 36.9 | 45.3 | 45.3 | 36.9 | 36.9 | 36.9 | 36.9 | 36.9 |
| Latex composition: | | | | | | | | | |
| 1,3-Butadiene | 70 | 73 | 70 | 70 | 70 | 70 | 70 | 70 | 70 |
| Styrene | | | | | | | | | |
| Methyl Methacrylate | 20 | | | | 20 | 20 | 20 | 20 | 20 |
| Acrylonitrile | | | 20 | 20 | | | | | |
| Ethyl Acrylate | | 20 | | | | | | | |
| Methacrylic acid | 6 | 3 | 6 | 6 | 6 | 6 | 6 | 6 | 6 |
| Divinyl Benzene | | | | 4 | | | | | |
| Etnylene Glycol DiMethacrylate | 4 | 4 | 4 | | 4 | 4 | 4 | 4 | 4 |
| Other components: | | | | | | | | | |
| SIS Elastomer (86% I)[1] | | 24.6 | 24.6 | 24.4 | 24.6 | 24.6 | 24.6 | 24.6 | 24.6 |

-continued

| Composition | | | | | | | | | |
|---|---|---|---|---|---|---|---|---|---|
| SIS Elastomer (83% I)[2] | | | | | | | | | |
| SB Elastomer (79% I)[3] | | | | | | | | | |
| SB Elastomer (70% B)[4] | | | | | | | | | |
| SEBS Elastomer (71% EB)[5] | | | | | | | | | |
| SI Elastomer (90% I)[6] | 24.6 | | | | | | | | |
| N,N-Dimethylaminopropyl Methacrylamide | 7.3 | 7.3 | 7.3 | 8.3 | 7.3 | 7.3 | 7.3 | 7.3 | 7.3 |
| Ethoxy Bisphenol A Diacrylate | 5.0 | 5.0 | 5.0 | | | | | | |
| Ethoxy Bisphenol A Dimethacrylate | | | | | | | | | |
| 1,6-Hexane diol Diacrylate | | | | | | | | | |
| 1,6-Hexane diol Dimethacrylate | 4.9 | 4.9 | | | 4.9 | | | | |
| Lauryl Methacrylate | 5.5 | 5.5 | | | | | | | |
| Dibutyl Fumarate | 15.0 | 15.0 | 15.5 | 15.5 | 15.5 | 15.5 | 15.5 | 20.5 | 25.5 |
| Urethane Acrylate[7] | | | 4.9 | | | 4.9 | | | |
| Urethane Acrylate[8] | | | | 5.6 | | | 4.9 | 4.9 | 4.9 |
| Isodecyl Acrylate | | 15.0 | 20.5 | | | | | | |
| 2-6-Butylanthraquinone | | 0.3 | | 0.3 | 0.3 | 0.3 | 0.3 | 0.3 | 0.3 |
| 2-Ethylanthraquinone | 0.3 | | | | | | | | |
| 2,6-di-t-Butyl-p-Cresol | 0.5 | 0.5 | 0.5 | 0.5 | 0.5 | 0.5 | 0.5 | 0.5 | 0.5 |
| Property | | | | | | | | | |
| Shore A Hardness | 57 | 38 | 62 | 52 | 54 | 58 | 40 | 34 | 32 |
| Resilence (%) | 39 | 46 | 32 | 51 | 39 | 37 | 46 | 52 | 55 |
| Tensile Strength (kg/sq.cm) | 32 | 16 | 37 | 17 | 53 | 57 | 57 | 30 | 10 |
| Elongation (%) | 108 | 134 | 186 | 150 | 142 | 200 | 204 | 176 | 262 |
| Bending Resistance (mm) | 0 | 0 | 0 | 2 | 0 | 0 | 0 | 0 | 0 |
| Processing Time (min.) | 6 | 8 | 14 | 6 | 10 | 10 | 12 | 10 | 14 |

| | Example | | | | | | |
|---|---|---|---|---|---|---|---|
| Composition | 17 | 18 | 19 | 20 | 21 | 22 | 23 |
| Latex Content | 41.5 | 49.2 | 49.2 | 41.9 | 36.9 | 40.7 | 41.5 |
| Latex composition: | | | | | | | |
| 1,3-Butadiene | 73 | 69 | 69 | 67 | 70 | 70 | 73 |
| Styrene | | | | | | | |
| Methyl Methacrylate | | 20 | 20 | 20 | 20 | | |
| Acrylonitrile | | | | | | | |
| Ethyl Acrylate | 20 | | | | | | 20 |
| Methacrylic acid | 3 | 9 | 9 | 9 | 6 | 6 | 3 |
| Divinyl Benzene | | 2 | 2 | | | 4 | |
| Etnylene Glycol DiMethacrylate | 4 | | | 4 | 4 | | 4 |
| Other components: | | | | | | | |
| SIS Elastomer (86% I)[1] | | | | 28.6 | 24.6 | 30.8 | |
| SIS Elastomer (83% I)[2] | 22.3 | | | | | | |
| SB Elastomer (79% I)[3] | | 12.3 | | | | | |
| SB Elastomer (70% B)[4] | | | 12.3 | | | | |
| SEBS Elastomer (71% EB)[5] | | | | | | 22.3 | |
| SI Elastomer (90% I)[6] | | | | | | | |
| N,N-Dimethylaminopropyl Methacrylamide | 3.8 | 7.3 | 7.3 | 8.6 | 7.3 | 7.3 | 3.8 |
| Ethoxy Bisphenol A Diacrylate | | 5.0 | 5.0 | 3.2 | 5.0 | | |
| Ethoxy Bisphenol A Dimethacrylate | | | | | | | |
| 1,6-Hexane diol Diacrylate | | | | | | | |
| 1,6-Hexane diol Dimethacrylate | | 4.9 | 4.9 | 4.9 | 4.9 | | |
| Lauryl Methacrylate | | 5.5 | 5.5 | 5.5 | 5.5 | | |
| Dibutyl Fumarate | 26.5 | 15.0 | 15.0 | 9.6 | 10.0 | 15.5 | 26.5 |
| Urethane Acrylate[7] | | | | | | 4.9 | |
| Urethane Acrylate[8] | 5.1 | | | | | | 5.1 |
| Isodecyl Acrylate | | | | | | | |
| 2-6-Butylanthraquinone | 0.3 | | | | | 0.3 | 0.3 |
| 2-Ethylanthraquinone | | 0.3 | 0.3 | 0.3 | 0.3 | | |
| 2,6-di-t-Butyl-p-Cresol | 0.5 | 0.5 | 0.5 | 0.5 | 0.5 | 0.5 | 0.5 |
| Property | | | | | | | |
| Shore A Hardness | 32 | 67 | 68 | 65 | 62 | 51 | 38 |
| Resilence (%) | 61 | 37 | 38 | 36 | 47 | 56 | |
| Tensile Strength (kg/sq.cm) | 10 | 22 | 17 | 46 | 48 | 28 | 6 |
| Elongation (%) | 184 | 50 | 33 | 193 | 131 | 253 | 120 |
| Bending Resistance (mm) | 0 | 6 | 6 | 0 | 0 | 0 | 2 |

|                       |   |   |   |   |    |    |    |
|-----------------------|---|---|---|---|----|----|----|
| -continued            |   |   |   |   |    |    |    |
| Processing Time (min.)| 8 | 8 | 8 | 9 | 12 | 11 | 13 |

Footnotes for the table:
[1]Kraton ® D-1107, a linear copolymer
[2]Kraton ® D-1117, a linear copolymer
[3]Kraton ® D-1116, a branched copolymer
[4]Kraton ® D-4158, a branched copolymer
[5]Kraton ® D-1652, a linear copolymer
[6]Kraton ® D-1320X, a branched copolymer
[7]Ebecryl 4830 (Radcure Specialities)
[8]C-9504 (Sartomer Co.)

These results establish that a wide range of components may be used in the compositions of the invention, and that substantial deviations from the established ranges result in diminished properties.

Although particular embodiments of the invention have been described in detail for purposes of illustration, various modifications may be made without departing from the spirit and scope of the invention. Accordingly, the invention is not to be limited except as by the appended claims.

What is claimed is:

1. A water-developable photosensitive printing medium having a composite structure, comprising discrete domains of water-dispersible latex copolymer, said copolymer comprising the polymerization product of an aliphatic diene monomer, an α,β-ethylenically unsaturated carboxylic acid, and a polyfunctional α,β-ethylenically unsaturated vinyl monomer, discrete domains of a linear elastomeric block copolymer, and a photopolymerizable interstitial phase that binds the domains of latex copolymer and elastomer copolymer together, said interstitial phase containing a photopolymerizable compound, a basic nitrogen atom containing compound having a tertiary basic nitrogen atom and a photoinitiator, said photopolymerizable compound being an ethylenically unsaturated compound containing at least one ethylenically unsaturated group and being capable of forming a polymer by free-radical polymerization.

2. The printing medium of claim 1, wherein the domains have a maximum dimension of from about 0.1 to about 0.5 micrometers.

3. The printing medium of claim 1, wherein the elastomer is a polymer having at least one unit of a general formula selected from the block copolymer group consisting of (A-B-A), (A-B)$_n$, and (A-B), where A is a non-elastomeric polymer block having a number average molecular weight of 2,000 to 100,000 and a glass transition temperature of above about 25° C., and B is an elastomeric polymer block having a number average molecular weight of 25,000 to 1,000,000 and a glass transition temperature of below about 10° C.

4. The printing medium of claim 1, wherein the discrete domains of the latex copolymer occupy from about 25 to about 75 percent by volume of the medium.

5. The printing medium of claim 1, wherein the discrete domains of the elastomer occupy from about 15 to about 50 percent by volume of the medium.

6. A water-developable photosensitive printing medium, comprising, a latex copolymer comprising an aliphatic conjugated diene monomer, an α,β-ethylenically unsaturated carboxylic acid, and a polyfunctional α,β-ethylenically unsaturated compound;

a linear thermoplastic, elastomeric block copolymer having at least one unit of a general formula selected from the block copolymer group consisting of (A-B-A), (A-B)$_n$, and (A-B), wherein A is a non-elastomeric polymer block having a number average molecular weight of 2,000 to 100,000 and a glass transition temperature of above about 25° C., and B is an elastomeric polymer block having a number average molecular weight of 25,000 to 1,000,000 and a glass transition temperature below about 10° C.;

a basic nitrogen atom-containing compound having a tertiary basic nitrogen atom;

an ethylenically unsaturated compound containing at least one terminal ethylenically unsaturated group, said compound being capable of forming a polymer by free-radical chain polymerization; and a polymerization initiator which, upon exposure to actinic, light, initiates free-radical chain polymerization of the ethylenically unsaturated compound.

7. The printing medium of claim 6, wherein the aliphatic conjugated diene monomer is selected from the group consisting of 1,3-butadiene, isoprene, dimethylbutadiene, and chloroprene.

8. The printing medium of claim 6, wherein the α,β-ethylenically unsaturated carboxylic acid is selected from the group consisting of (meth)acrylic acid, maleic acid, fumaric acid, citraconic acid, and crotchic acid.

9. The printing medium of claim 6, wherein the polyfunctional compound is selected from the group consisting of trimethylolpropane di(meth)acrylate, trimethylolpropane tri(meth)acrylate, divinylbenzene, ethylene glycol di(meth)acrylate, polyethylene glycol di(meth)acrylate, pentaerythritol tri(meth)acrylate, 1,4-butane diol di(meth)acrylate, and 1,6-hexane diol di(meth)acrylate.

10. The printing medium of claim 6, wherein the latex copolymer further contains a monofunctional vinyl monomer.

11. The printing medium of claim 10, wherein the monofunctional vinyl monomer is selected from the group consisting of styrene, alpha-methylstyrene, vinyltoluene, acrylonitrile, vinyl chloride, vinylidene chloride, (meth)acrylamide, methyl (meth)acrylate, ethyl (meth)acrylate, n-butyl (meth)acrylate, and 2-ethylhexyl (meth)acrylate.

12. The printing medium of claim 6, wherein the non-elastomeric unit A is the polymerization product of aromatic hydrocarbons containing vinyl unsaturation.

13. The printing medium of claim 6, wherein the non-elastomeric unit A is polystyrene.

14. The printing medium of claim 6, wherein the elastomeric unit B is the polymerization product of aliphatic conjugated diolefinic compounds.

15. The printing medium of claim 6, wherein the elastomeric unit B is selected from the group consisting of polybutadiene, polyisoprene, and the combination of ethylene and butylene.

16. The printing medium of claim 6, wherein the basic nitrogen atom-containing compound is selected from the group consisting of N,N-dimethylaminoethyl (meth)acrylate, N,N-dimethylaminopropyl (meth)acrylamide, N,N-dimethylaminopropyl (meth)acrylate, N,N-dimethylaminoethyl-N'-(meth)acryloylcarbamate, N,N-dimethylaminoethoxyethanol, and N,N-dimethylaminoethoxyethoxyethanol.

17. The printing medium of claim 6, wherein the ethylenically unsaturated compound is selected from the group consisting of an unsaturated carboxylic ester, a divinyl ester, an acrylated urethane, a methacrylated urethane, and a di(meth)acrylic ester of a diepoxypolyether derived from an aromatic compound with polyalcohols.

18. A water-developable photosensitive printing medium, comprising, from about 25 to about 75 percent by weight of a latex copolymer comprising from about 5 to about 95 mol percent of an aliphatic conjugated diene monomer, from about 1 to about 30 mol percent of an $\alpha,\beta$-ethylenically unsaturated carboxylic acid, from about 1 to about 30 mol percent of a polyfunctional $\alpha,\beta$-ethylenically unsaturated vinyl monomer, and from about 0 to about 70 mol percent of a monofunctional vinyl monomer;

from about 15 to about 50 percent by weight of a linear thermoplastic, elastomeric block copolymer having at least one unit of a general formula selected from the block copolymer group consisting of (A-B-A), (A-B)$^n$, and (A-B), wherein A is a nonelastomeric polymer block having a number average molecular weight of 2,000 to 100,000 and a glass transition temperature of above about 20° C., and B is an elastomeric polymer block having a number average molecular weight of 25,000 to 1,000,000 and a glass transition temperature below about 10° C.;

a basic nitrogen atom-containing compound having a tertiary basic nitrogen atom present in an amount of from about 0.02 to about 2.5 mole per mole of acid groups in the latex copolymer;

from about 10 to about 60 percent by weight of an ethylenically unsaturated compound containing at least one ethylenically unsaturated group, the compound being capable of forming a polymer by free-radical chain polymerization; and from about 0.001 to about 10 percent by weight of a polymerization initiator which, upon exposure to actinic light, initiates free-radical chain polymerization of the ethylenically unsaturated compound.

19. A flexible printing element, comprising a supporting substrate and a layer thereon of the photosensitive printing medium of claims 1 or 6.

20. The water-developable photosensitive printing medium of claims 1, 6 or 18 in which said basic nitrogen atom containing compound has a vinyl group capable of participating in free radical polymerization with said ethylenically unsaturated compound upon exposure to actinic light.

* * * * *

UNITED STATES PATENT AND TRADEMARK OFFICE
CERTIFICATE OF CORRECTION

PATENT NO. : 5,348,844
DATED : September 20, 1994
INVENTOR(S) : William R. Wagner It is certified that error appears in the above-indentified patent and that said Letters Patent is hereby corrected as shown below:

On the title page Item [19],"Garmong" should read --Wagner--.

On the title page Inventor should read

-- [75]Inventor: William R. Wanger--.

Signed and Sealed this

Twenty-eight Day of February, 1995

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,348,844
DATED : September 20, 1994
INVENTOR(S) : William R. Wagner It is certified that error appears in the above-indentified patent and that said Letters Patent is hereby corrected as shown below:

Title page, item [19], "Garmong" should read --Wagner--.

Title page, item [75], "Inventor: should read William R. Wagner--.

This certificate supersedes Certificate of Correction issued February 28, 1995.

Signed and Sealed this

Twenty-eight Day of March, 1995

Attest:

BRUCE LEHMAN

Attesting Officer     Commissioner of Patents and Trademarks